(12) United States Patent
Tan et al.

(10) Patent No.: US 9,257,638 B2
(45) Date of Patent: Feb. 9, 2016

(54) METHOD TO ETCH NON-VOLATILE METAL MATERIALS

(71) Applicant: Lam Research Corporation, Fremont, CA (US)

(72) Inventors: Samantha S.H. Tan, Fremont, CA (US); Wenbing Yang, Fremont, CA (US); Meihua Shen, Fremont, CA (US); Richard P. Janek, Oakland, CA (US); Jeffrey Marks, Saratoga, CA (US); Harmeet Singh, Fremont, CA (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/325,190

(22) Filed: Jul. 7, 2014

(65) Prior Publication Data

US 2015/0280113 A1    Oct. 1, 2015

Related U.S. Application Data

(60) Provisional application No. 61/971,032, filed on Mar. 27, 2014.

(51) Int. Cl.
| | |
|---|---|
| *H01L 27/22* | (2006.01) |
| *H01L 43/12* | (2006.01) |
| *H01L 43/02* | (2006.01) |
| *H01L 43/10* | (2006.01) |

(52) U.S. Cl.
CPC .............. *H01L 43/12* (2013.01); *H01L 27/228* (2013.01); *H01L 43/02* (2013.01); *H01L 43/10* (2013.01)

(58) Field of Classification Search
CPC ....... H01L 21/70; H01L 21/702; H01L 21/71; H01L 43/00
See application file for complete search history.

(56) References Cited

U.S. PATENT DOCUMENTS

| 5,834,357 | A   | * | 11/1998 | Kang ............................ 438/396 |
| 2002/0150196 | A1  |   | 10/2002 | Fulconis et al. |
| 2009/0256220 | A1  | * | 10/2009 | Horng et al. ................... 257/421 |
| 2012/0276657 | A1  | * | 11/2012 | Joubert et al. ..................... 438/3 |

OTHER PUBLICATIONS

Gallagher et al., "Development of the magnetic tunnel junction MRAM at IBM: From first junctions to a 16-Mb MRAM demonstrator chip," IBM J. Res & Dev., vol. 50, No. 1, Jan. 2006, 19 pages.

* cited by examiner

*Primary Examiner* — Cheung Lee
(74) *Attorney, Agent, or Firm* — Beyer Law Group LLP

(57) ABSTRACT

A method for etching a stack with an Ru containing layer disposed below a hardmask and above a magnetic tunnel junction (MTJ) stack with pinned layer is provided. The hardmask is etched with a dry etch. The Ru containing layer is etched, where the etching uses hypochlorite and/or $O_3$ based chemistries. The MTJ stack is etched. The MTJ stack is capped with dielectric materials. The pinned layer is etched following the MTJ capping.

18 Claims, 5 Drawing Sheets

METHOD TO ETCH NON-VOLATILE METAL MATERIALS

CROSS REFERENCE TO RELATED APPLICATIONS

This application claims priority under 35 U.S.C. §119(e) from U.S. Provisional Patent Application No. 61/971,032, filed on Mar. 27, 2014, entitled "METHODS TO ETCH AND TO REMOVE POST ETCH METALLIC RESIDUE" which is hereby incorporated by reference for all purposes.

BACKGROUND OF THE INVENTION

The present invention relates to etching a layer of non volatile materials through a mask during the production of a semiconductor device. More specifically, the present invention relates to etch a metal magnetic tunnel junctions (MTJ) stack.

During semiconductor wafer processing, features may be etched through a metal containing layer. In the formation of magnetic random access memories (MRAM) or resistive random-access memory (RRAM) devices, a plurality of thin metal layers or films may be sequentially etched. For MRAM a plurality of thin metal layers may be used to form magnetic tunnel junction stacks.

SUMMARY OF THE INVENTION

To achieve the foregoing and in accordance with the purpose of the present invention, a method of etching a stack with an Ru containing layer disposed below a hardmask and above a magnetic tunnel junction (MTJ) stack with a pinned layer is provided. The hardmask is etched with a dry etch. The Ru containing layer is etched, where the etching uses hypochlorite and/or $O_3$ based chemistries. The MTJ stack is etched. The MTJ stack is capped with dielectric materials. The pinned layer is etched following the MTJ capping.

In another manifestation of the invention, a method of etching a stack comprising a hard mask over a Ru containing layer, over a magnetic tunnel junction (MTJ) stack over a pinned layer is provided. The hardmask, Ru containing layer, and MTJ stack are etched. The MTJ stack is sealed. The pinned layer is etched.

In another manifestation of the invention, a method of etching a stack with a pinned layer disposed below a MTJ stack, disposed below an Ru containing layer, disposed below a hardmask layer is provided. The hardmask is etched with a dry etch. The Ru containing layer is etched. The MTJ stack is etched. The MTJ stack is capped with dielectric materials. The pinned layer is etched with chemistries selective to noble metals, comprising $SOCl_2$/pyridine mixtures, HBr/DMSO mixtures, or a mixture of $CCl_4$ with at least one of DMSO, acetonitrile, benzonitrile, or dimethylformamide (DMF).

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
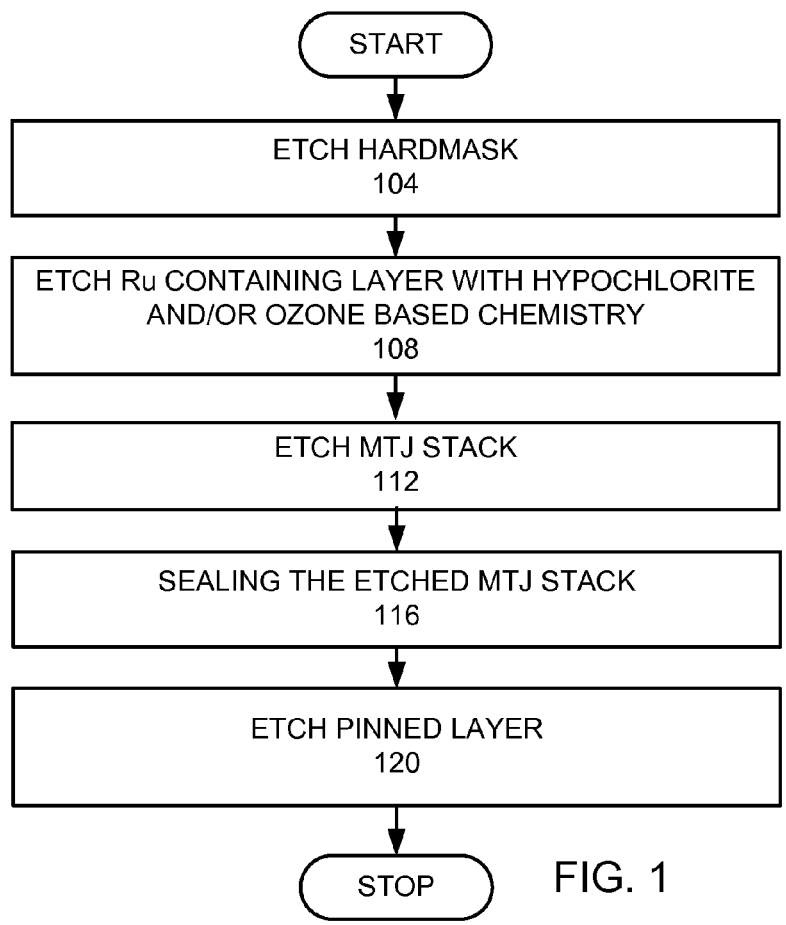
FIG. 1 is a high level flow chart of an embodiment of the invention.

To facilitate understanding, FIG. 1 is a high level flow chart of a process used in an embodiment of the invention. A substrate with a stack with a Ru containing layer disposed below a hardmask and above a magnetic tunnel junction (MTJ) stack is provided. The hardmask is etched or opened (step 104). The Ru containing layer is etched using hypochlorite and/or ozone based chemistry (step 108). The MTJ stack is etched (step 112). The etched MTJ stack is sealed (step 116). A magnetic pinned layer is etched (step 120). Such a magnetic pinned layer is described in *Development of the magnetic tunnel junction MRAM at IBM: From first junctions to a* 16-*Mb MRAM demonstrator chip*, IBM J. RES. & DEV. VOL. 50 NO. 1 JAN. 2006, which is incorporated by reference for all purposes.

EXAMPLES

Figure 2A:
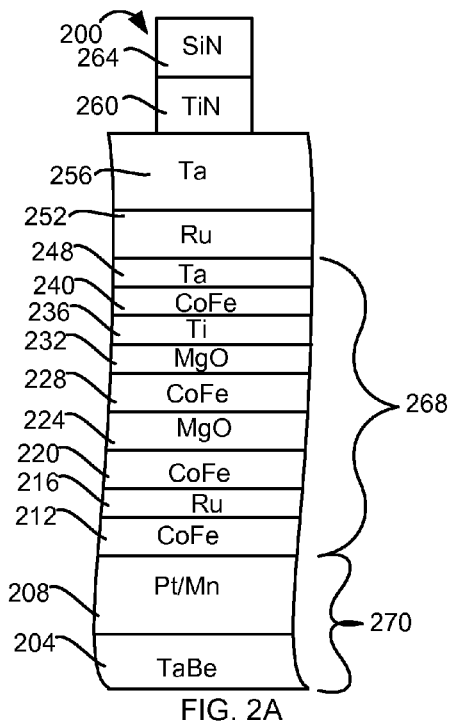
FIGS. 2A-G are schematic views of a stack processed according to an embodiment of the invention.

FIG. 2A is a cross-sectional view of a stack 200, which in this example is used for magnetic random access memories (MRAM). In this example the bottom layer of the stack 200 is a tantalum beryllium (TaBe) layer 204 formed over a substrate. A platinum manganese (PtMn) layer 208 is formed over the TaBe layer 204. A first cobalt iron (CoFe) layer 212 is formed over the PtMn layer 208. A first ruthenium (Ru) layer 216 is formed over the first CoFe layer 212. A second CoFe layer 220 is formed over the first Ru layer 216. A first magnesium oxide (MgO) layer 224 is formed over the second CoFe layer 220. A third CoFe layer 228 is formed over the first MgO layer 224. A second MgO layer 232 is formed over the third CoFe layer 228. A titanium (Ti) layer 236 is formed over the second MgO layer 232. A fourth CoFe layer 240 is formed over the Ti layer 236. A first tantalum (Ta) layer 248 is formed over the fourth CoFe layer 240. A second Ru layer 252 is formed over the first Ta layer 248. A second Ta layer 256 is formed over the second Ru layer 252. A mask comprising a titanium nitride (TiN) layer 260 and a silicon nitride (SiN) layer 264 is patterned over the second Ta layer 256. In this example, the layers including and between the first CoFe layer 212 and the first Ta layer 248 form a magnetic tunnel junction (MTJ) layer 268. The PtMn layer 208 and the TaBe layer 204 form a pinned layer 270. The pinned layer 270 may be formed from other materials.

Figure 3:
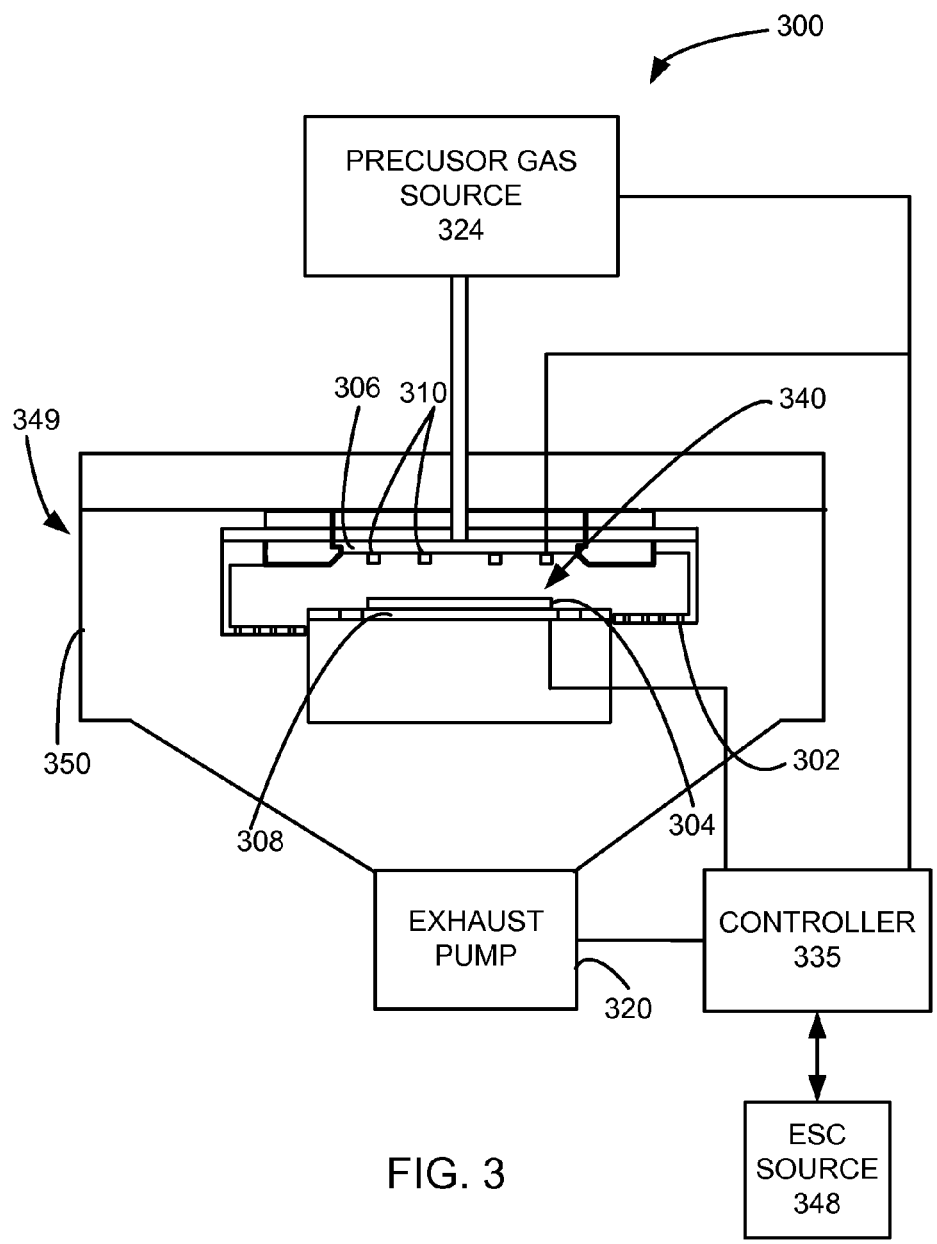
FIG. 3 is a schematic view of an etch reactor that may be used for etching.

In one embodiment, all processing may be performed in a single plasma etch chamber. FIG. 3 is a schematic view of an etch reactor that may be used in practicing such an embodiment. In one or more embodiments of the invention, an etch reactor 300 comprises a gas distribution plate 306 providing a gas inlet and a chuck 308, within an etch chamber 349, enclosed by a chamber wall 350. Within the etch chamber 349, a substrate 304 on which the stack is formed is positioned on top of the chuck 308. The chuck 308 may provide a bias from the ESC source 348 as an electrostatic chuck (ESC) for holding the substrate 304 or may use another chucking force to hold the substrate 304. A heat source 310, such as heat lamps, is provided to heat the metal layer. A precursor gas source 324 is connected to the etch chamber 349 through the distribution plate 306.

Figure 4:
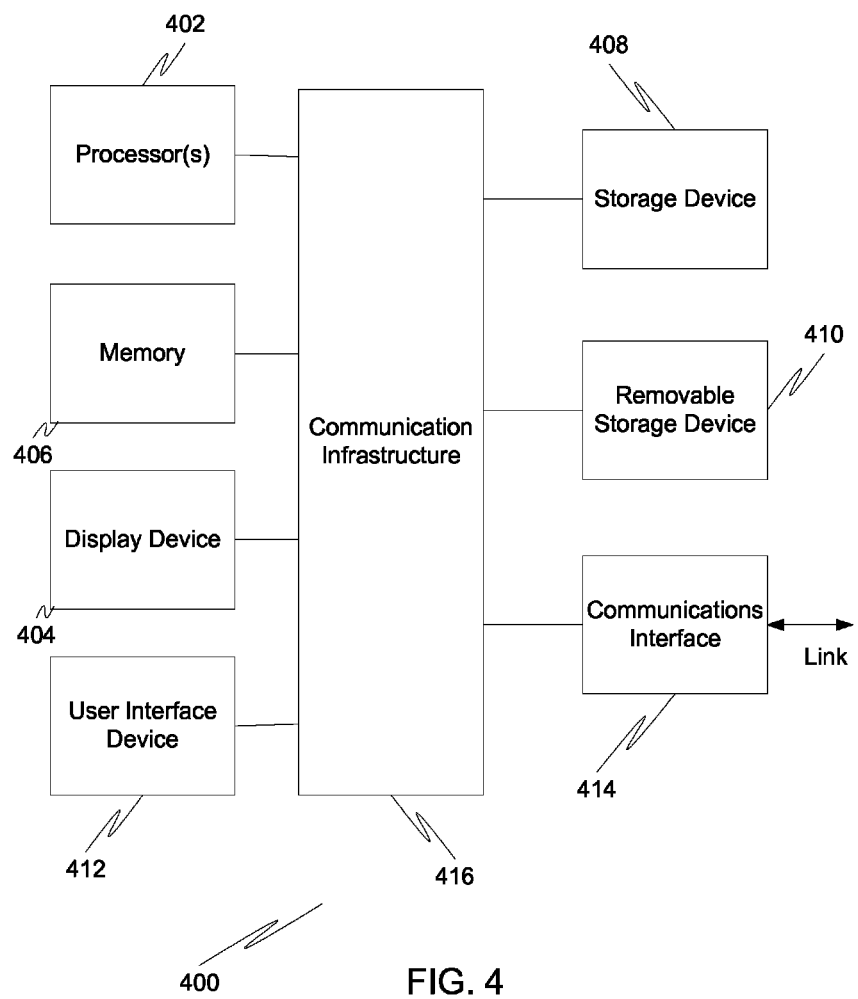
FIG. 4 illustrates a computer system, which is suitable for implementing a controller used in embodiments of the present invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
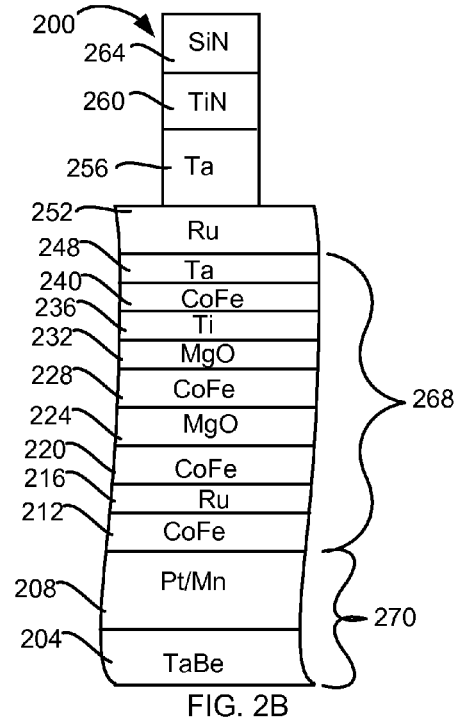

The hardmask is etched or opened (step 104). In this example, the hardmask is the Ta layer 256. The SiN layer 264 and TiN layer 260 are used as a mask for etching the Ta layer 256. In this embodiment, a plasma etch is used to etch the Ta layer 256. In this embodiment a dry etch using $Cl_2$ as the etch gas may be used. FIG. 2B is a cross-sectional view of the stack 200 after the Ta layer 256 has been etched.

Figure 2C:
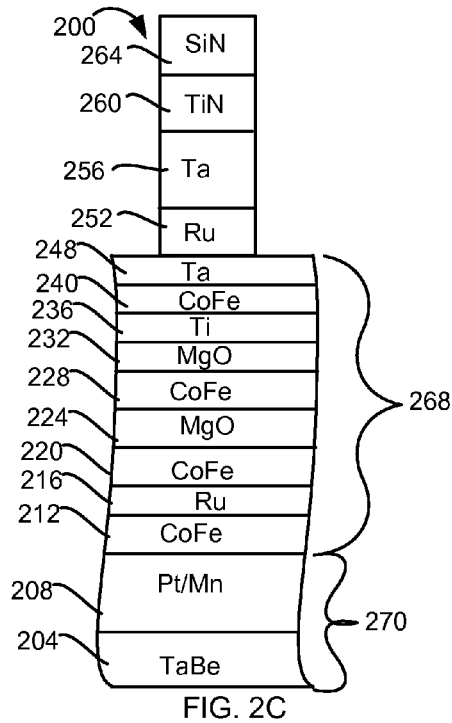

The second Ru layer 252 is etched (step 108) using hypochlorite and/or ozone based chemistries. In one embodiment, a plasma etch may be used to provided the hypochlorite and ozone chemistry based etch. In another embodiment the hypochlorite and ozone based chemistries may be used in a wet etch. In such an embodiment, a diluted hydrogen fluoride (dHF) preclean may be used to remove silicon oxide residue, before etching the second Ru layer 252. A NaClO aqueous solution may be used in a wet etch to etch the second Ru layer 252. In this example, the Ru etch is wet etched using a NaClO aqueous solution. Other hypochlorite etch processes include HClO in a Na-free solution with pH>12; organic hypochlorite R—OCl in organic solvent, R-including alkyl (—CH3. —CH2CH3, —C(CH3)3 et al), cycloalkly, or acromatic carbonyl. FIG. 2C is a cross-sectional view of the stack 200 after the second Ru layer 252 has been etched. Examples of a Ru wet etch using an ozone containing aqueous solution with pH >12 include ozone saturated NaOH, $NH_4OH$, or tetramethyammonium hydroxide solution.

Figure 2D:
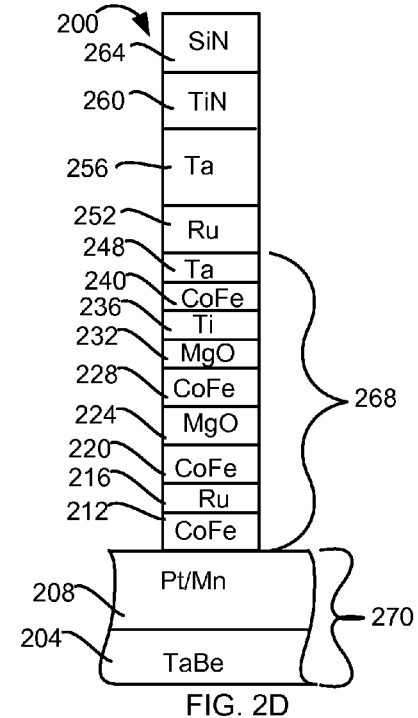

The MTJ stack 268 is etched (step 112) with a recess into the pinned layer. The recess allows subsequent capping with dielectric to seal the MTJ and pinned layer interface. In this embodiment a low bias ion sputtering is used to etch the MTJ stack 268. In this embodiment, the gas used during this step consists essentially of argon (Ar). Preferably, the low bias provides a bias is between 10 and 500 volts. More preferably, the low bias is between 20 and 300 volts. Most preferably, the low bias is between 100 and 200 volts. It has been unexpectedly found that a low bias ion sputtering without a chemical etchant gas, but only an inert bombardment gas provides a MTJ etch with reduced MTJ deposition. A chemical etchant gas is a gas with a component that etches using a chemical reaction. An inert bombardment gas does not use a chemical reaction for etching, but only uses physical bombardment for etching. FIG. 2D is a cross-sectional view of the stack 200 after the second MTJ stack 268 has been etched.

Figure 2E:
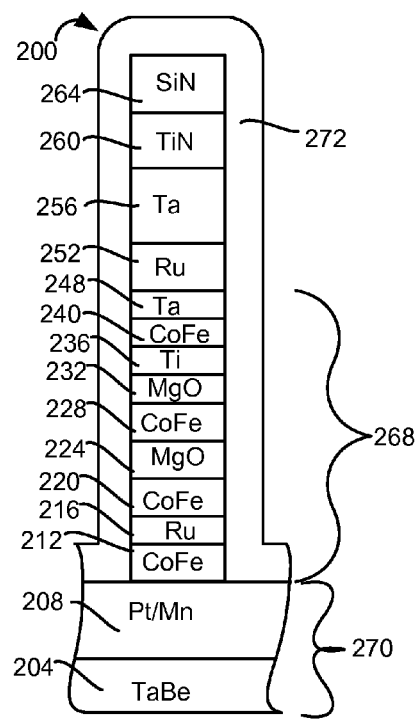

The etched MTJ stack 268 is sealed (step 116) by depositing conformal insulating layer 272 consisting of dielectric materials. This capping layer 272 encapsulates the opened MTJ stacks to keep the MTJ stacks free from damage that would have been caused by the following processes to etch bottom layers. Equally important, the capping layer also separates etch processes of following layers apart from the process of etching the MTJ stack 268. Two common categories of damages on MTJ include: etch product re-depositing on MTJ sidewall, which leads to shorting of the MTJ and etch chemical reacting with MTJ layers to degrade the magnetic properties. Thus in traditional processes when all stack were etched without capping layer the MTJ stacks were damaged. Any etch process which damages MgO or CoFeB is not acceptable, including $H_2O$, oxygen, halogen based chemical or plasma system etches. Choosing the proper capping layer enables the isolation of the opened MTJ from failure or degradation in the following process flow. The idea cap layers thus open the window to exploit a variety of processes, including those non-compatible with MgO/CoFeB, to etch following layers and maintain the electrical/magnetic properties of MTJ from degradation. A variety of insulating cap layers can be chosen, such as silicon-based dielectric film, SiN, SiC, SiCN, $SiO_2$, SiOC, ,$SiOCH_xCH_3$, Si; carbon-based dielectric films (carbon, polymer), nitride compound (BN). In this example, we demonstrated the capping layer with $SiO_2$ and SiN. A plasma is formed from $SiH_4$ and $O_2$ to deposit a layer of $SiO_2$ over the etched stack. In another embodiment a layer of SiN is deposited. FIG. 2E is a cross sectional view of the stack 200 after a deposited layer 272 of $SiO_2$ has been deposited.

Figure 2F:
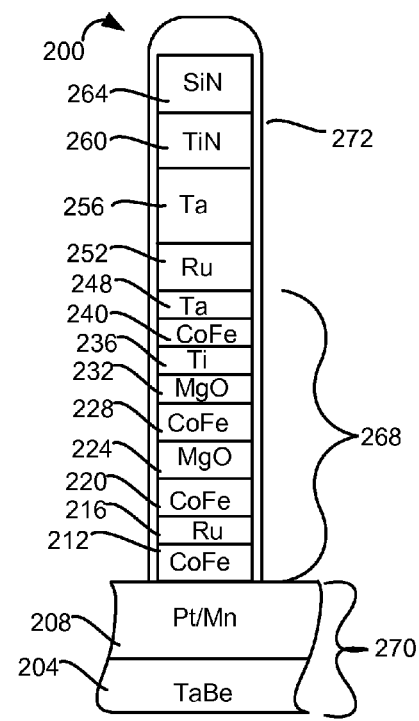

The deposited layer 272 is etched back (opened) to expose the underlying PtMn layer 208, while the sidewall of MTJ stack 268 remains sealed. In this embodiment, a CF$_4$ and Ar plasma opening process is used to open the deposited layer. FIG. 2F is a cross-sectional view of the stack 200 after the deposited layer 272 has been opened. The bottom of the deposited layer 272 is completely removed. The sidewalls of the deposited layer 272 may be thinned, but remain to seal the MTJ stack 268.

Figure 2G:
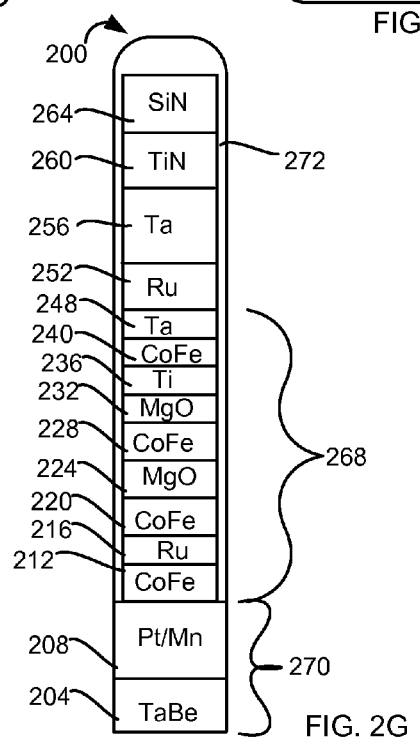

The pinned layer 270 is etched (step 120). In one embodiment, the pinned layer 270 is etched with a dry plasma etch. In another embodiment, the pinned layer 270 is etched using a wet etch. Examples include mixture of pyridine with thionyl chloride (SOCl$_2$) with varied ratio, and dilute mixture in organic solvent include but not limited to acetonitrile. HBr and DMSO mixtures are also used to etch PtMn and other noble metal containing pinned layer. A mixture of CCl$_4$ with at least one of DMSO, acetonitrile, benzonitrile, or dimethylformamide (DMF) is also used to etch PtMn and other noble metal containing pinned layer. FIG. 2G is a cross-sectional view of the stack 200 after the pinned layer 270 has been etched. Additional processing steps, such as removing the deposited layer 272, may be used to form the stack 202 into MRAM.

Some embodiments of the inventions provide many advantages over the prior art. For example, the sealing of the MTJ stack 268 eliminates damage of the MTJ stack 268 during the etching of the pinned layer (step 120). In addition, using a low bias ion sputter instead of a chemical etch or high bias ion sputter for etching the MTJ stack 268, further reduces damage to the MTJ stack 268. A chemical etch of the MTJ stack 268 would harm some of the MTJ stack 268 layers. It was unexpectedly found that a low bias ion sputter would cause less redeposition of the MTJ stack 268 materials. The reduction of redeposited MTJ materials improves device quality, since redeposited material may cause shorting between layers. The removal of such redeposited material may damage the MTJ layers. Damage to the MTJ stack 268 would undesirably change the magnetic properties of the MRAM. The use of hypochlorite and/or ozone based chemistries to etch the second Ru layer 248 has been expectedly found to provide an improved selective etch for the Ru layer 284, which requires a different etch recipe than the recipe used to etch the MTJ stack 268. Ru is very inert. Hypchlorite is a strong oxidizing agent required to oxidize the inert Ru. The different and selective etches in these two steps result in less MTJ stack 268 damage and redeposition. In other embodiments, the MTJ stack 268 may comprise other layers or may be in another order or may have more or less layers. The MTJ stack 268 is essential form forming MRAM.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method of etching a stack with an Ru containing layer disposed below a hardmask and above a magnetic tunnel junction (MTJ) stack with a pinned layer, comprising:
    etching the hardmask with a dry etch;
    etching the Ru containing layer wherein the etching uses hypochlorite and/or O$_3$ based chemistries;
    etching the MTJ stack;
    capping the MTJ stack with dielectric materials; and etching the pinned layer following the MTJ capping;
    wherein the MTJ etch uses a low bias sputter of a plasma formed from an inert gas instead of a chemical etchant gas.

2. The method, as recited in claim 1, wherein the low bias sputter provides a bias of 10 to 500 volts.

3. The method, as recited in claim 2, wherein the etching the Ru containing layer provides a wet etch.

4. The method, as recited in claim 3, wherein the MTJ stack comprises at least one layer of CoFe and at least one layer of MgO.

5. The method, as recited in claim 4, wherein the pinned layer comprises at least one layer of PtMn.

6. The method, as recited in claim 5, wherein the etching the hardmask, etching the Ru containing layer, etching the MTJ layer, capping the MTJ layer, and etching the pinned layer are performed in a single plasma processing chamber.

7. The method, as recited in claim 6, wherein the etching the MTJ stack uses an inert bombardment gas, which provides a physical bombardment without a chemical etchant gas.

8. The method, as recited in claim 7, wherein the dielectric material of the capping is a silicon-based dielectric material.

9. The method, as recited in claim 1, wherein the etching the Ru containing layer provides a wet etch.

10. The method, as recited in claim 1, wherein the MTJ stack comprises at least one layer of CoFe and at least one layer of MgO.

11. The method, as recited in claim 1, wherein the pinned layer comprises at least one layer of PtMn.

12. The method, as recited in claim 1, wherein the etching the hardmask, etching the Ru containing layer, etching the MTJ layer, capping the MTJ layer, and etching the pinned layer are performed in a single plasma processing chamber.

13. The method, as recited in claim 1, wherein the etching the MTJ stack uses an inert bombardment gas, which provides a physical bombardment without a chemical etchant gas.

14. The method, as recited in claim 1, wherein the dielectric material of the capping is a silicon-based dielectric material.

15. A method of etching a stack comprising a hard mask over a Ru containing layer, over a magnetic tunnel junction (MTJ) stack over a pinned layer, comprising:
    etching the hardmask, Ru containing layer, and MTJ stack;
    sealing the MTJ stack; and
    etching the pinned layer;
    wherein the etching the MTJ stack uses a low bias sputter of a plasma formed from an inert gas instead of a chemical etchant gas, wherein the low bias sputter provides a bias of 10 to 500 volts.

16. The method, as recited in claim 15, wherein the MTJ stack comprises at least one layer of CoFe and at least one layer of MgO.

17. The method, as recited in claim 15, wherein the sealing the MTJ stack seals the MTJ stack with a silicon-based dielectric material.

18. A method of etching a stack with a pinned layer disposed below a MTJ stack, disposed below an Ru containing layer, disposed below a hardmask layer, comprising:
    etching the hardmask with a dry etch;
    etching the Ru containing layer;
    etching the MTJ stack;
    capping the MTJ stack with dielectric materials; and
    etching the pinned layer with chemistries selective to noble metals, comprising SOCl$_2$/pyridine mixtures, HBr/

DMSO mixtures, or a mixture of $CCl_4$ with at least one of DMSO, acetonitrile, benzonitrile, or dimethylformamide (DMF).

\* \* \* \* \*